(12) United States Patent
Song et al.

(10) Patent No.: US 11,333,953 B2
(45) Date of Patent: May 17, 2022

(54) LIGHT SOURCE PACKAGE AND MOBILE DEVICE INCLUDING THE SAME

(71) Applicant: SAMSUNG ELECTRONICS CO., LTD., Suwon-si (KR)

(72) Inventors: Jongsup Song, Hwaseong-si (KR); Seolyoung Choi, Yongin-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 0 days.

(21) Appl. No.: 17/118,747

(22) Filed: Dec. 11, 2020

(65) Prior Publication Data

US 2021/0356844 A1 Nov. 18, 2021

(30) Foreign Application Priority Data

May 15, 2020 (KR) ........................ 10-2020-0058123

(51) Int. Cl.
| | |
|---|---|
| *G03B 15/05* | (2021.01) |
| *G02B 5/20* | (2006.01) |
| *H01S 5/02212* | (2021.01) |
| *H01S 5/02253* | (2021.01) |
| *H04N 5/225* | (2006.01) |
| *H01S 5/42* | (2006.01) |

(52) U.S. Cl.
CPC ............ *G03B 15/05* (2013.01); *G02B 5/208* (2013.01); *H01S 5/02212* (2013.01); *H01S 5/02253* (2021.01); *H01S 5/423* (2013.01); *H04N 5/2253* (2013.01); *H04N 5/2256* (2013.01); *G03B 2215/0503* (2013.01); *G03B 2215/0567* (2013.01); *G03B 2215/0592* (2013.01)

(58) Field of Classification Search
CPC ........................................................ G03B 15/05
USPC ......................................................... 348/370
See application file for complete search history.

(56) References Cited

U.S. PATENT DOCUMENTS

| | | |
|---|---|---|
| 6,372,608 B1 | 4/2002 | Shimoda et al. |
| 6,645,830 B2 | 11/2003 | Shimoda et al. |
| RE38,466 E | 3/2004 | Inoue et al. |
| 6,818,465 B2 | 11/2004 | Biwa et al. |
| 6,818,530 B2 | 11/2004 | Shimoda et al. |
| 6,858,081 B2 | 2/2005 | Biwa et al. |
| 6,967,353 B2 | 11/2005 | Suzuki et al. |
| 7,002,182 B2 | 2/2006 | Okuyama et al. |
| 7,084,420 B2 | 8/2006 | Kim et al. |
| 7,087,932 B2 | 8/2006 | Okuyama et al. |
| 7,154,124 B2 | 12/2006 | Han et al. |
| 7,208,725 B2 | 4/2007 | Sherrer et al. |

(Continued)

FOREIGN PATENT DOCUMENTS

KR 10-2014-0061117 A 5/2014

*Primary Examiner* — Joel W Fosselman
(74) *Attorney, Agent, or Firm* — Sughrue Mion, PLLC

(57) ABSTRACT

A light source package includes: a substrate; a first light source device disposed on the substrate, and configured to emit a light of a first wavelength; a second light source device disposed to be spaced apart from the first light source on the substrate, and configured to emit a light of a second wavelength, different from the first wavelength; and a light transmissive structure disposed above first and second light source devices, and including at least one first lens configured to increase a beam angle of the light of the first wavelength and at least one second lens configured to reduce a beam angle of the light of the second wavelength.

21 Claims, 21 Drawing Sheets

(56) References Cited

U.S. PATENT DOCUMENTS

| | | |
|---|---|---|
| 7,288,758 B2 | 10/2007 | Sherrer et al. |
| 7,319,044 B2 | 1/2008 | Han et al. |
| 7,501,656 B2 | 3/2009 | Han et al. |
| 7,709,857 B2 | 5/2010 | Kim et al. |
| 7,759,140 B2 | 7/2010 | Lee et al. |
| 7,781,727 B2 | 8/2010 | Sherrer et al. |
| 7,790,482 B2 | 9/2010 | Han et al. |
| 7,940,350 B2 | 5/2011 | Jeong |
| 7,959,312 B2 | 6/2011 | Yoo et al. |
| 7,964,881 B2 | 6/2011 | Choi et al. |
| 7,985,976 B2 | 7/2011 | Choi et al. |
| 7,994,525 B2 | 8/2011 | Lee et al. |
| 8,008,683 B2 | 8/2011 | Choi et al. |
| 8,013,352 B2 | 9/2011 | Lee et al. |
| 8,049,161 B2 | 11/2011 | Sherrer et al. |
| 8,129,711 B2 | 3/2012 | Kang et al. |
| 8,179,938 B2 | 5/2012 | Kim |
| 8,263,987 B2 | 9/2012 | Choi et al. |
| 8,324,646 B2 | 12/2012 | Lee et al. |
| 8,399,944 B2 | 3/2013 | Kwak et al. |
| 8,432,511 B2 | 4/2013 | Jeong |
| 8,459,832 B2 | 6/2013 | Kim |
| 8,502,242 B2 | 8/2013 | Kim |
| 8,536,604 B2 | 9/2013 | Kwak et al. |
| 8,735,931 B2 | 5/2014 | Han et al. |
| 8,766,295 B2 | 7/2014 | Kim |
| 9,322,901 B2 | 4/2016 | Kerness et al. |
| 9,992,474 B2 | 6/2018 | Grunnet-Jepsen et al. |
| 10,177,527 B2 | 1/2019 | Dummer et al. |
| 10,212,355 B2 | 2/2019 | Whitehouse et al. |
| 2002/0126963 A1* | 9/2002 | Burmeister ............ H01S 5/423 385/88 |
| 2013/0194787 A1* | 8/2013 | Geske ................... G01S 7/4815 362/157 |
| 2018/0343438 A1 | 11/2018 | Cho et al. |
| 2019/0109977 A1 | 4/2019 | Dutton et al. |

* cited by examiner

LIGHT SOURCE PACKAGE AND MOBILE DEVICE INCLUDING THE SAME

CROSS-REFERENCE TO RELATED APPLICATION(S)

This application is based on and claims priority from Korean Patent Application No. 10-2020-0058123 filed on May 15, 2020 in the Korean Intellectual Property Office, the disclosure of which is incorporated herein by reference in its entirety.

BACKGROUND

1. Field

Example embodiments of the inventive concept relate to a light source package and a mobile device including the same.

2. Description of Related Art

Recently, as mobile devices such as mobile phones have emphasized a camera function, a distance measurement method using a time-of-flight (TOF) method for measuring a distance at high speed has been used. However, in a light source package emitting a pulse light for measuring time-of-flight (TOF) has a problem in which the light source package is frequently damaged due to high power and low reliability. In addition, there is a problem in that this light source package for TOF measuring is disposed separately from a light source package for illuminating a subject.

SUMMARY

Example embodiments of the inventive provide a light source package in which a plurality light sources having different illumination lights are integrated with an improved robustness and reliability, and a method of manufacturing the same.

The example embodiments also provide a mobile device including a light source package.

According to an aspect of example embodiments, there is provide a light source package which may include: a substrate having first and second surfaces opposite to each other, and having a device mounting region; a first light source device disposed in the device mounting region, and configured to emit a light of a first wavelength; a second light source device disposed to be spaced apart from the first light source in the device mounting region, and configured to emit a light of a second wavelength, different from the first wavelength; a shield can disposed to enclose the first and second light source devices, and providing a light emitting window through which the lights of the first and second wavelengths are emitted out; and a light transmissive molding disposed above the light emitting window and including a first lens array overlapping the first light source device and a second lens array overlapping the second light source device.

According to an aspect of example embodiments, there is provided a light source package which may include: a substrate having a device mounting region; a vertical cavity surface emitting laser (VCSEL) device disposed in the device mounting region; a shield can disposed to enclose the VCSEL device, and providing a light emitting window through which a light emitted from the VCSEL device is output; and a light transmissive molding disposed above the light emitting window and supporting the shield can, the light transmissive molding including a lens array formed of a plurality of lenses having a predetermined pitch and disposed to overlap the light emitting window.

According to an aspect of example embodiments, there is provided a mobile device which may include: a housing having a first surface and a second surface opposite to each other; a camera module mounted on at least one of the first and second surfaces of the housing; and one of the above light source packages mounted adjacent to the camera module on at least one of the first and second surfaces of the housing.

BRIEF DESCRIPTION OF DRAWINGS

The above and other aspects, features, and advantages of the example embodiments will be more clearly understood from the following detailed description, taken in conjunction with the accompanying drawings, in which.

DETAILED DESCRIPTION

Hereinafter, example embodiments of the present inventive concept will be described with reference to the accompanying drawings.

It will be understood that when an element or layer is referred to as being "over," "above," "on," "below," "under," "connected to" or "coupled to" another element or layer, it can be directly over, above, on, below, under, connected or coupled to the other element or layer or intervening elements or layers may be present. In contrast, when an element is referred to as being "directly over," "directly above," "directly on," "directly below," "directly under," "directly connected to" or "directly coupled to" another element or layer, there are no intervening elements or layers present. Like numerals refer to like elements throughout.

Figure 1:
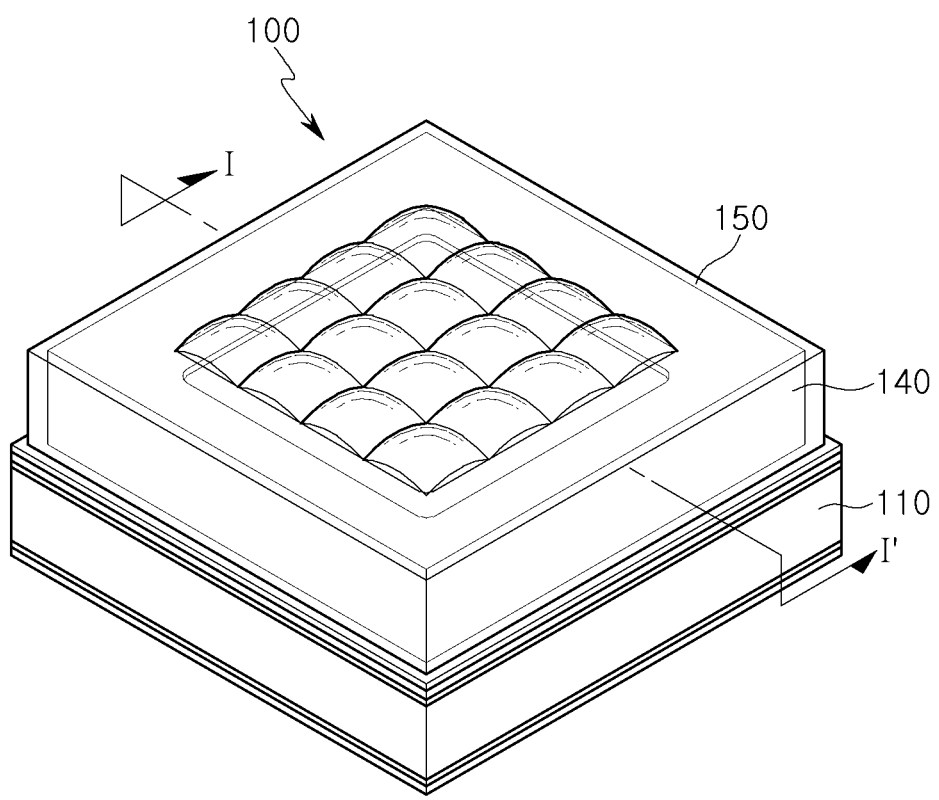
FIG. 1 is a perspective view illustrating a light source package according to an example embodiment.
Figure 2:
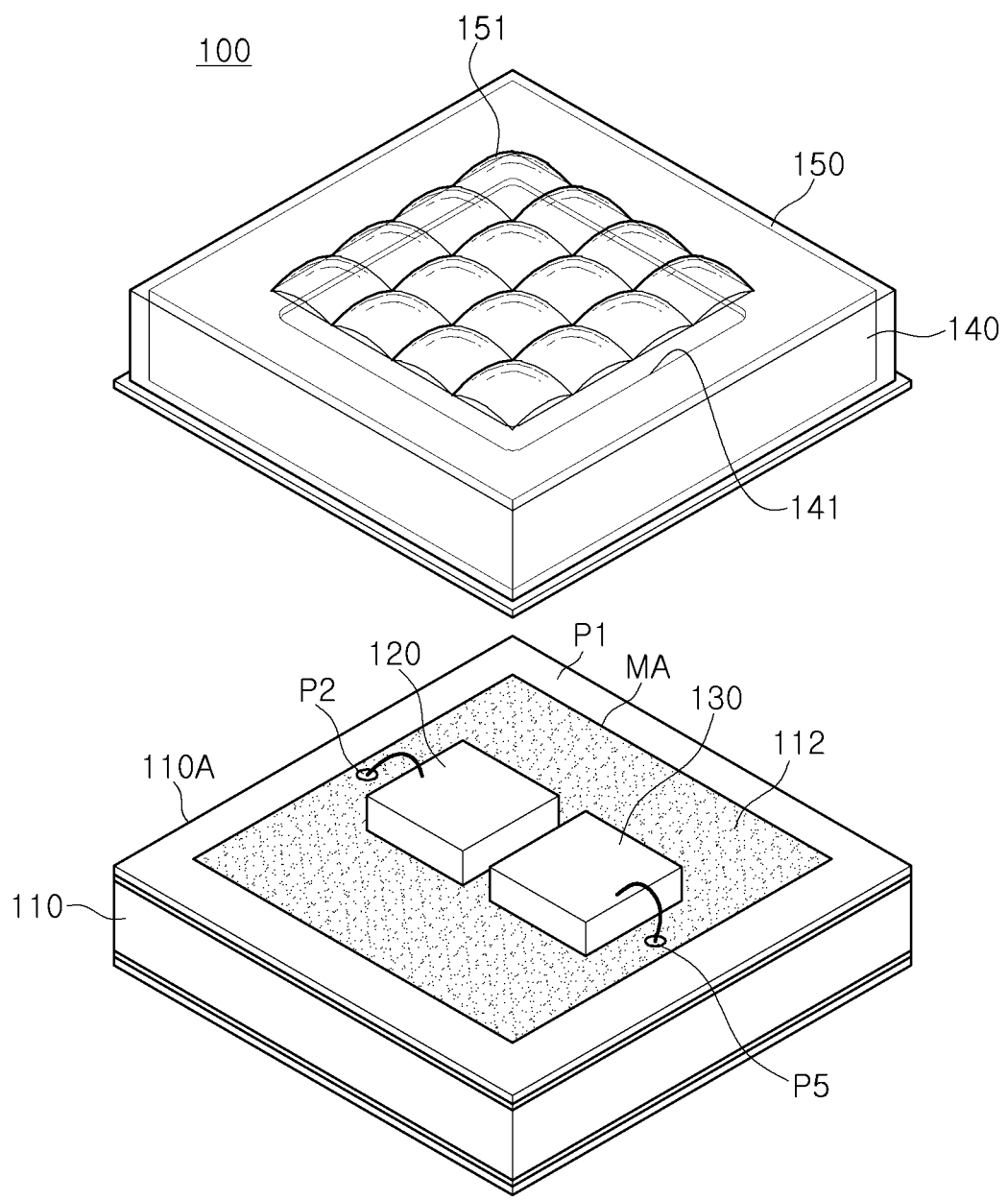
FIG. 2 is an exploded perspective view illustrating the light source package shown in FIG. 1, according to an example embodiment.
Figure 3:
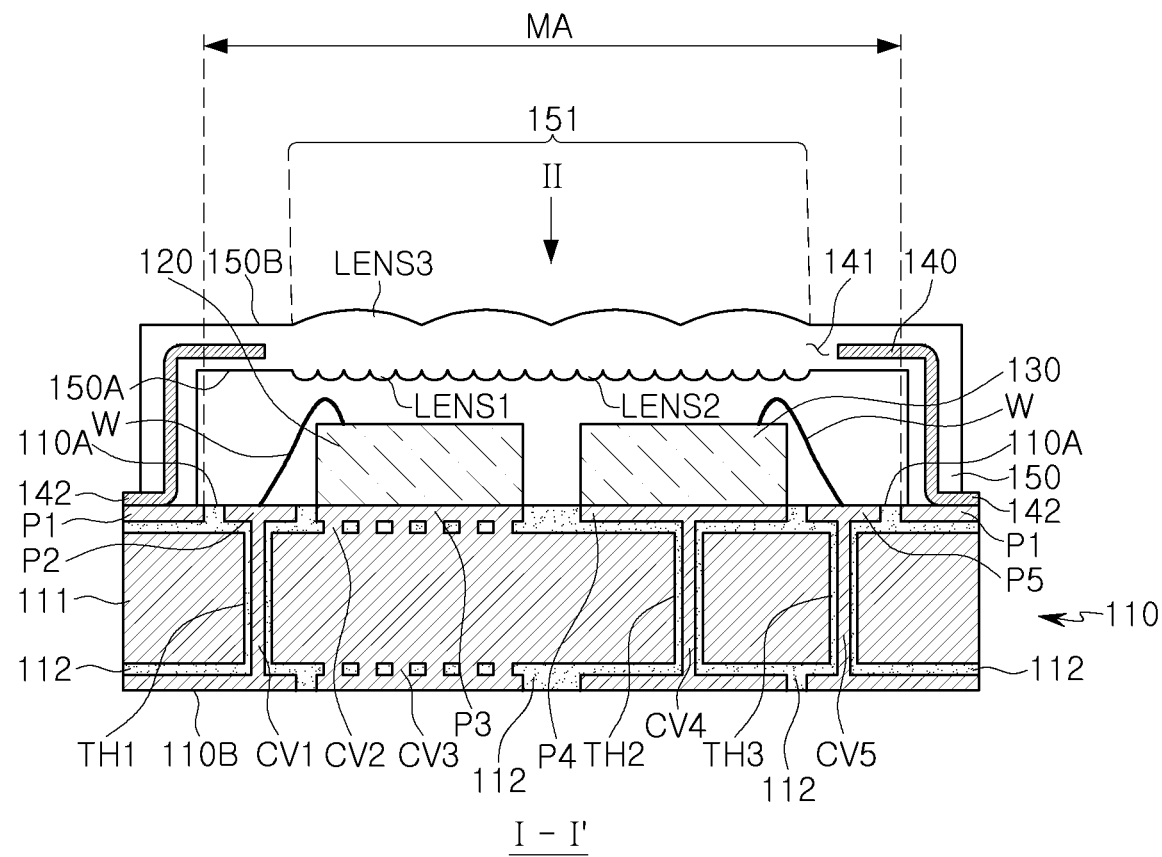
FIG. 3 is a cross-sectional view taken along a line I-I' of FIG. 1, according to an example embodiment.

FIG. 1 is a perspective view of a light source module according to an embodiment, and FIG. 2 is an exploded view of the light source module shown in FIG. 1, and FIG. 3 is a cross-sectional view taken along a line I-I' of FIG. 1.

Referring to FIGS. 1 and 2, a light source package 100 according to the present embodiment includes a substrate 110, first and second light source devices 120 and 130 disposed adjacent to each other on an upper surface of the substrate 110, a shield can 140 enclosing or covering the first and second light source devices 120 and 130 and having a light emitting window 141, and a light transmissive molding 150 covering the light emitting window 141.

The substrate 110 may be, for example, a substrate such as a printed circuit board (PCB), a metal core PCB (MCPCB), a metal PCB (MPCB), a flexible PCB (FPCB), a ceramic substrate, or the like, and the first and second light sources may be electrically connected to a circuit of the substrate 110. In some embodiments, additional devices, such as Zener diodes, may be mounted on the substrate 110. In the present embodiment, the substrate 110 may be an MPCB as an example.

Referring to FIG. 3, the substrate 110 may be a metal base wiring board, and have first and second surfaces 110A and 110B opposite to each other, and may include a metal plate 111 having a plurality of through-holes TH1 to TH3 penetrating the substrate 110 from the first surface 110A to the second surface 110B. The metal plate 111 may include metal or an alloy having high thermal conductivity and electrical conductivity. For example, the metal plate 111 may include copper (Cu), aluminum (Al), or alloys thereof.

Referring to FIGS. 2 and 3, a device mounting region MA in which the first and second light source devices 120 and 130 are mounted is disposed at a center of the first surface 110A of the substrate 110, and a ground electrode P1 may be disposed at a periphery of the device mounting region MA. The ground electrode P1 is a region in which the shield can 140 is grounded, and may be used to electrically shield the shield can 140 disposed to cover a light source having a high output to shield electromagnetic interference noise (EMI) emitted from the light source. A plurality pads P2 to P5 to which the first and second light source devices 120 and 130 are connected may be disposed in the device mounting region MA. The first and second light source devices 120 and 130 may be surface-mounted on pads P3 and P4, respectively, among the plurality of pads P1 to P5, and connected to pads P2 and P5, respectively, among the plurality of pads P1 to P5 by a wire W.

The substrate 110 may include a vertical wiring structure connecting the first surface 110A and the second surface 110B. As illustrated in FIG. 3, such a vertical wiring structure may include a plurality of vias CV1, CV4, and CV5 respectively disposed in the plurality of through holes TH1 to TH3. The plurality of vias CV1, CV4, and CV5 may be electrically insulated from the metal plate 111 by an insulating structure 112. In addition, vias CV2 and CV3 penetrating the insulating structure 112 and connected to the metal plate 111 may be included below a pad P3. As such, due to a structure in which the first and second light source devices 120 and 130 directly contact the metal plate 111, the substrate 110 may have a high heat dissipation efficiency, so even if a light source having high power is mounted, such that heat generated from the light source can be effectively dissipated through the metal plate 111.

Figure 8:
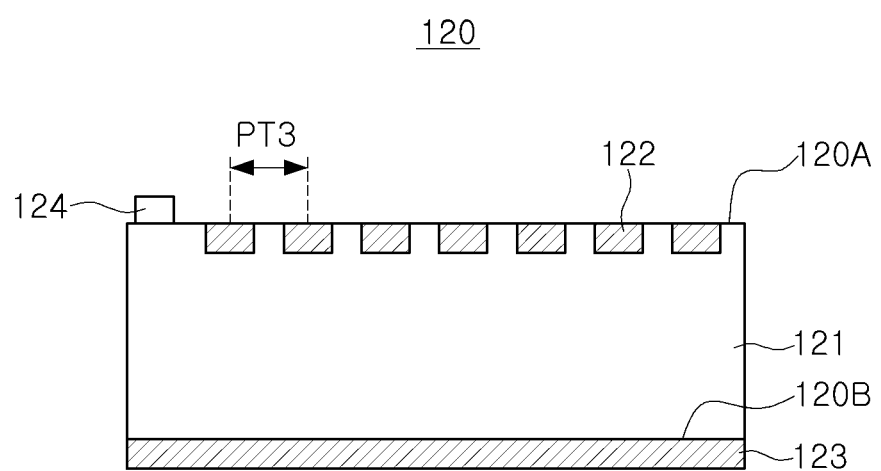
FIG. 8 is a cross-sectional view of a VCSEL device that may be employed in a light source package, according to an example embodiment.

In the present embodiment, the first light source device 120 may be a vertical cavity surface emitting laser (VCSEL) device. The VCSEL device may be an apparatus emitting a near-infrared light from an emitter disposed on its surface. This will be described in detail with reference to FIG. 8. FIG. 8 is a cross-sectional view of a VCSEL device that may be employed in the light source package of the present embodiment.

Referring to FIG. 8, in the VCSEL device, a plurality of emitters 122 and a first electrode 124 may be disposed on a front surface 120A of a body 121, and a second electrode 123 may be disposed on a rear surface 120B of the body 121. In an embodiment, the near-infrared light (about 940 nm) having a high output (about 2 W or more) may be emitted at a very narrow beam angle (about 30°) from the plurality of emitters 122. The near-infrared light emitted from the plurality of emitters 122 may be a pulse light, and in an embodiment, it may flash at a period of about 100 to 400 MHz. The plurality of emitters 122 may be disposed in a two-dimensional array having a predetermined pitch PT3, such as a matrix array. Therefore, the light emitted from each of the plurality of emitters 122 may be irradiated to a front of the first light source device 120 in a form of a two-dimensional array of dot matrix. The near-infrared light emitted from a VCSEL device in the form of a two-dimensional array of dot matrix may be used as a pulse for distance measurement in a time-of-flight (TOF) method.

Figure 9:
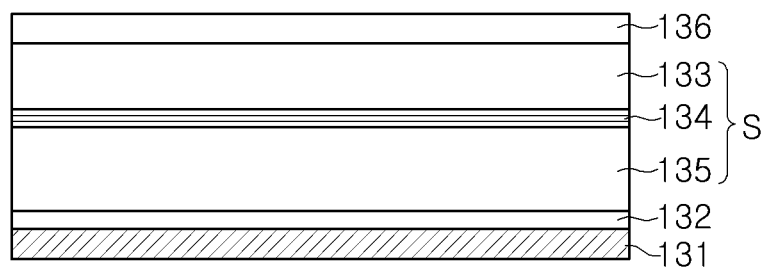
FIG. 9 is a cross-sectional view of an LED device that may be employed in a light source package, according to an example embodiment.

In the present embodiment, the second light source device 130 may be a light emitting diode (LED) device. The LED device may emit a white light having a different wavelength from the near-infrared light emitted from the first light source device 120. The second light source device 130 may include an LED chip and a wavelength conversion device. This will be described in detail with reference to FIG. 9.

The LED device may include a light emitting structure S disposed on a support substrate 131 and a transparent electrode layer 136 disposed on one surface of the light emitting structure S. The light emitting structure S may include a second conductivity-type semiconductor layer 135, an active layer 134, and a first conductivity-type semiconductor layer 133 sequentially disposed on the support substrate 131.

The support substrate 131 may be a substrate made of a material having conductivity or an insulating substrate having an electrode structure such as conductive vias connected in a vertical direction of the support substrate 131. The support substrate 131 serves to support the light emitting structure S, and at the same time, provides electrodes therein for applying power to the second conductivity-type semiconductor layer 135. The support substrate 131 may be attached to the light emitting structure S through a conductive adhesive layer 132. The conductive adhesive layer 132 is intended to further enhance the contact between the second conductivity-type semiconductor layer 135 and the support substrate 131, and may include an Ag paste and eutectic metal such as Au/Ge, Au/In, Au/Sn containing Au, or the like.

The light emitting structure S may include the first and second conductivity-type semiconductor layers 133 and 135 and an active layer 134. The first conductivity-type semiconductor layer 133 may be a nitride semiconductor satisfying n-type $In_xAl_yGa_{1-x-y}N$ ($0 \leq x \leq 1$, $0 \leq y \leq 1$, $0 \leq x+y \leq 1$), and an n-type impurity may be Si. For example, the first conductivity-type semiconductor layer 133 may include n-type GaN. The second conductivity-type semiconductor layer 135 may be a nitride semiconductor layer satisfying p-type $In_xAl_yGa_{1-x-y}N$ ($0 \leq x < 1$, $0 \leq y \leq 1$, $0 \leq x+y < 1$), and a p-type impurity may be Mg. For example, the second conductivity-type semiconductor layer 135 may be implemented in a single layer structure, but may have a multi-layer structure having different compositions, as in the present example embodiment.

The active layer 134 may have a multiple quantum well (MQW) structure in which a quantum well layer and a quantum barrier layer are alternately stacked. For example, the quantum well layer and the quantum barrier layer may be $In_xAl_yGa_{1-x-y}N$ ($0 \leq x \leq 1$, $0 \leq y \leq 1$, $0 \leq x+y \leq 1$) having different compositions. In a specific example, the quantum well layer may be $In_xGa_{1-x}N$ ($0 < x \leq 1$), and the quantum barrier layer may be GaN or AlGaN. The thicknesses of the quantum well layer and the quantum barrier layer may range from 1 nm to 50 nm, respectively. The active layer 134 may be not limited to a multi-quantum well structure, and may be a single quantum well structure.

A transparent electrode layer 136 may be disposed on the first conductivity-type semiconductor layer 133 of the light emitting structure S. The transparent electrode layer may employ a transparent conductive oxide (TCO) material such as indium tin oxide (ITO), and graphene may be used as necessary.

The LED device having such a structure has a very wide beam angle of a light compared to the VCSEL device, and when the LED device is used as a flash for photographing an image, it is necessary to reduce the beam angle of the light to concentrate the light only in a region that can be photographed by the camera. In the present embodiment, a lens array for reducing the beam angle of a light may be disposed in the light emitting window 141 through which a light emitted from the LED device is transmitted, thereby increasing an amount of the light per unit area of the light emitted forward.

Referring to FIGS. 2 and 3, the shield can 140 may be disposed to cover the first and second light source devices 120 and 130, to block an EMI noise that can be emitted from the first and second light source devices 120 and 130, and an end portion 142 may be grounded to the ground electrode P1 of the substrate 110. The light emitting window 141 may be disposed in a central region of the shield can 140 so as to overlap the device mounting region MA in which the first and second light source devices 120 and 130 are disposed, such that the lights emitted from the first and second light source devices may be irradiated to the front of the shield can 140 through the light emitting window 141. The shield can 140 may be manufactured by rolling a steel plate such as nickel silver, stainless steel, or aluminum alloy in a can shape.

The light transmissive molding 150 may be disposed to cover the light emitting window 141 of the shield can 140, and may be formed by molding a light transmissive resin in the shield can 140 so as to cover the shield can 140 as a whole. However, according to an embodiment, the light transmissive molding 150 may be disposed to cover the light emitting window 141 of the shield can 140 rather than entirely covering the shield can 140. The end portion 142 of the shield can 140 may be exposed to an outside of the light transmissive molding 150 so as to be electrically connected to the ground electrode P1 of the substrate 110. A lens unit 151 for adjusting the beam angle of lights emitted from the first and second light source devices 120 and 130 may be disposed in a region of the light transmissive molding 150 overlapping the light emitting window 141.

The light transmissive molding 150 may have a first surface 150A facing the first and second light source devices 120 and 130 and a second surface 150B opposite to the first surface 150A, and the lens unit 151 may be disposed on the first surface 150A. According to an embodiment, the lens unit 151 may also be disposed on the second surface 150B. The lens unit 151 may include one or more lens arrays each of which is formed of a plurality of lenses. In the present embodiment, two lens arrays LA1 and LA2 are disposed on the first surface 150A of the light transmissive molding 150, and one lens array LA3 is disposed on the second surface 150B. The first to third lens arrays LA1, LA2, and LA3 may be disposed to overlap the light emitting window 141 of the shield can 140, to have a region overlapping the first and second light source devices 120 and 130, respectively.

Figure 4:
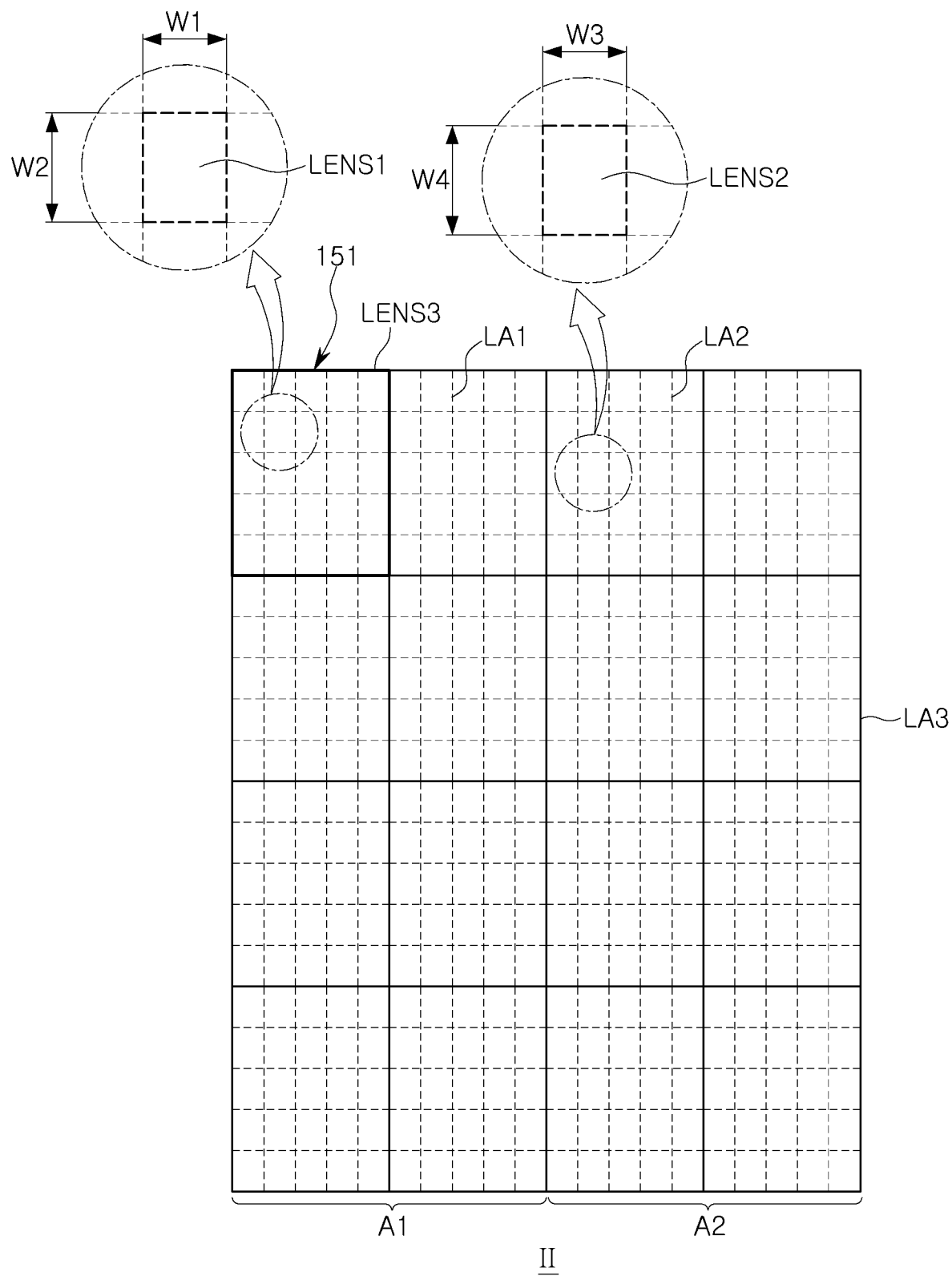
FIG. 4 is a plan view illustrating a lens array shown in FIG. 1, according to an example embodiment.

The first to third lens arrays LA1, LA2, and LA3 may include a plurality of lenses for adjusting light distribution characteristics light from the first and second light source devices 120 and 130, respectively. This will be described with reference to FIGS. 4 and 5. FIG. 4 is a plan view illustrating the lens array shown in FIG. 1, and FIG. 5 is an enlarged view of the lens array of FIG. 3.

Referring to FIG. 4, when viewed from above, the first and second lens arrays LA1 and LA2 may be disposed to overlap the first region A1 and the second region A2 of the third lens array LA3, respectively. The first and second lens arrays LA1 and LA2 may be composed of a plurality of lenses LENS1 and LENS2, respectively. The first lens array LA1 may include a plurality of first lenses LENS1 having a first pitch PT1, and the second lens array LA2 may include a plurality of second lenses LENS2 having a second pitch PT2. The plurality of first lenses LENS1 and the plurality of second lenses LENS2 may have the same optical axis of light emitted from the first and second light source devices 120 and 130, respectively. The plurality of first lenses LENS1 and the plurality of second lenses LENS2 may have a rectangular shape when viewed from above, and may be formed into a rectangle in which a ratio of each of horizontal W1 and W3 and vertical W2 and W3 is 3:4. This means a ratio corresponding to 4:3, which is a ratio of a width to a height of an image captured by an imaging device included in a camera. In this case, the first pitch PT1 and the second pitch PT2 may be equal to each other. Therefore, the plurality of first lenses LENS1 and the plurality of second lenses LENS2 may have the same area when viewed from above, although an appearance of the lens is different. In the present embodiment, the first and second pitches PT1 and PT2 may be any one of values in a range of 15 to 50 μm. When the first and second pitches PT1 and PT2 of the first and second lens arrays LA1 and LA2 are less than 15 μm, the shape of the lens may be not normally formed, and thus the function as a lens may not be normally performed, and when they exceed 50 μm, optical cross talks between neighboring lenses may occur. According to an embodiment, each of the first and second pitches PT1 and PT2 may be the same as or different from the predetermined pitch PT3 of the plurality emitters 122 of the first light source device 120, that is, the VCSEL device, shown in FIG. 8.

Figure 5:
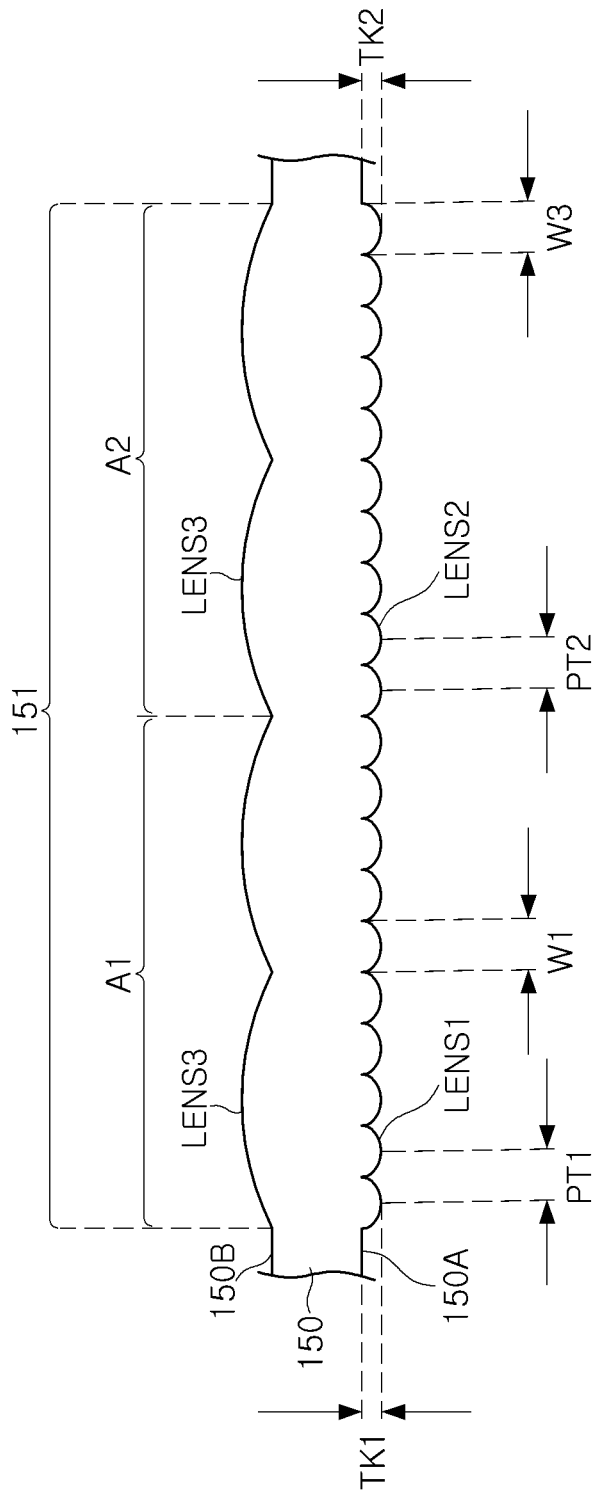
FIG. 5 is an enlarged view of the lens array of FIG. 3, according to an example embodiment.
Figure 6:
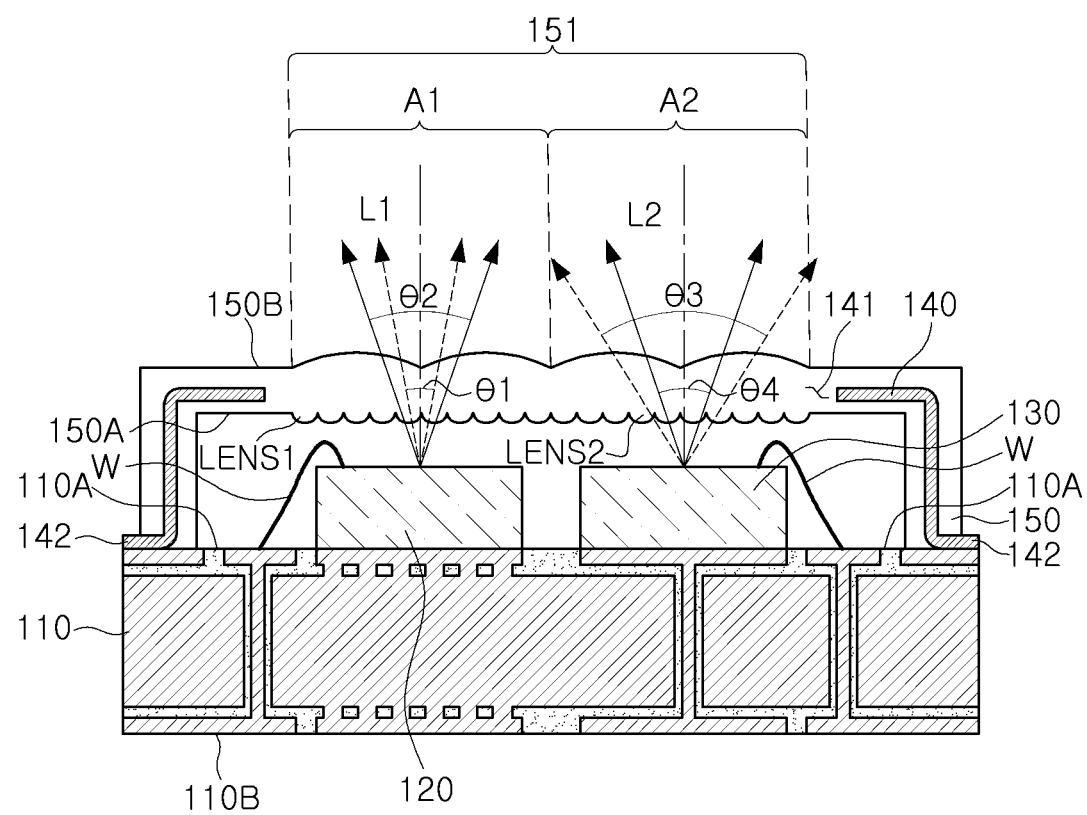
FIG. 6 is a view illustrating a beam angle of a light emitted from the light source package shown in FIG. 2, according to an example embodiment.

Referring to FIGS. 5 and 6, the plurality of first lenses LENS1 may have the same shape, and each of them may be formed of a concave lens or a convex lens according to embodiments. The plurality of first lenses LENS1 may have a surface shape capable of increasing a beam angle of a light L1 emitted from the VCSEL device, the first light source device 120, from a first beam angle θ1 to a second beam angle θ2. In addition, contrary to the plurality of first lenses LENS1, the plurality of second lenses LENS2 has may have a surface shape capable of reducing a beam angle of a light L2 emitted from the LED device, which is the second light source device 130, from a third beam angle θ3 to a fourth beam angle θ4. For example, the surface shape of the plurality of first lenses LENS1 may have a ratio of height TK1 and a diameter W1 of TK1/W1<1, and the surface shape of the plurality of second lenses LENS2 may have a ratio of height TK2 and a diameter W3 of TK2/W3>1. As in the present embodiment, when the plurality of first lenses LENS1 and the plurality of second lenses LENS2 have a rectangular bottom surface, the diameter W1 and W3 may be the smaller widths or lengths of the rectangular bottom surfaces, respectively.

Accordingly, the lights emitted from the first and second light source devices 120 and 130 have different beam angles, but transmit through the first and second lens arrays LA1 and LA2, respectively, and may be adjusted to the second and fourth beam angles θ2 and θ4 that are similar to each other.

Figure 7A:
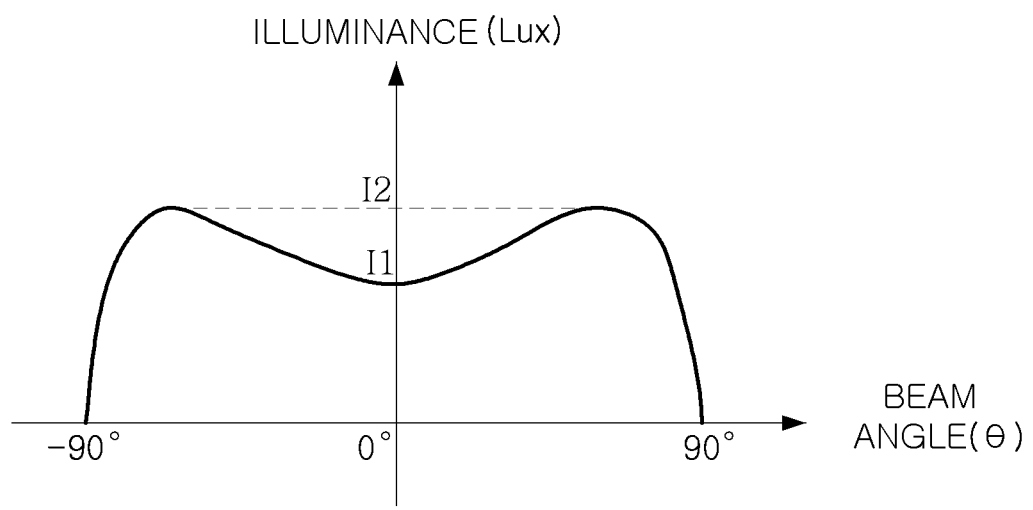
FIG. 7A is an illuminance distribution according to an angle after a light emitted from the vertical cavity surface emitting laser (VCSEL) device of FIG. 6 is transmitted through a first lens array, according to an example embodiment.
Figure 7B:
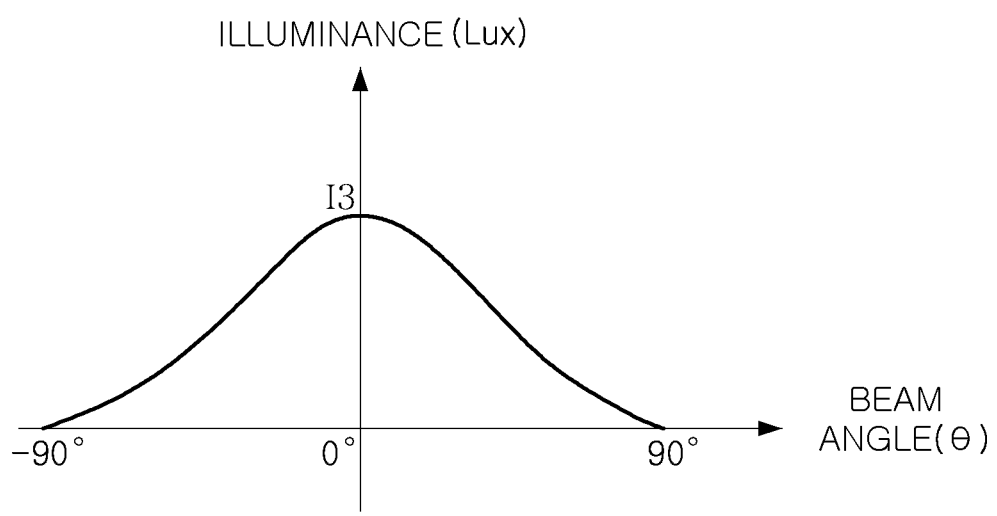
FIG. 7B is an illuminance distribution according to an angle after a light emitted from the light emitting diode (LED) of FIG. 6 is transmitted through a second lens array, according to an example embodiment.

FIG. 7A illustrates an illuminance distribution according to an angle after a light emitted from the VCSEL device, which is the first light source device 120, is transmitted through the first lens array LA1 of the light transmissive molding 150. FIG. 7A shows that a directivity of the light is increased as a whole such that a highest illuminance value I2 is located between beam angles of 0° and ±90°, and the highest illuminance value I2 was 120% than that of an illuminance value I1 when the beam angle is 0°, and the illuminance distribution has a shape of a batwing. FIG. 7B illustrates an illuminance distribution according to an angle after a light emitted from the LED device, which is the second light source device 130, is transmitted through the second lens array LA2 of the light transmissive molding 150. FIG. 7B shows that a directivity of the light is reduced as a whole such that a highest illuminance value I3 is located at a beam angle of 0°.

The third lens array LA3 may be disposed on the second surface 150B to overlap the first and second lens array LA2, and may be formed of a plurality of third lenses LENS3 having the same shape as a whole. In the present embodiment, each of the plurality of third lenses LENS3 may be provided to have the same area as 25 of the first lens LENS1 or the second lens LENS2. Therefore, when viewed from above, they may be disposed such that the first and second lens arrays LA1 and LA2 are projected onto the third lens array LA3. In the present embodiment, one third lens LENS3 may be disposed to overlap 25 of the first lens LENS1 or the second lens LENS2. According to an embodiment, each of the plurality of third lenses LENS3 may be formed of a convex lens or a concave lens.

A material forming the light transmissive molding 150 is not particularly limited as long as it is a light transmitting material, and thus, a light transmitting resin such as a silicone resin, an epoxy resin, an acrylic resin, and the like, may be used. In the present embodiment, a silicone resin may be used as the light transmitting resin. The light transmissive molding 150 may be formed by a transfer mold method in which the shield can 140 is disposed inside the mold and a flowable resin is flowed therein.

The light source package having the above-described configuration may be used as a light source for distance measurement in the TOF method for measuring a distance between a subject and a camera. According to the TOF method, after irradiating a pulse light on the subject, a time until the pulse light reflected from the subject is received is measured, and a distance between the subject and the camera is calculated based on the measured time. However, since a light emitted from the VCSEL device, which is generally used as a light source for the pulse light, has a high output (about 2 W or more) and is irradiated with a very narrow beam angle (about 30°), when a subject is a human, a retina may be damaged when (the light emitted from the VCSEL device is) directly irradiated on eyes. In order to prevent such a retinal damage, a method of reducing an amount of a light per unit area by increasing a beam angle of the light emitted from the VCSEL device is used. To this end, a method of increasing the beam angle of the light emitted from the VCSEL device by placing a glass substrate with a lens made of a resin material on a front surface of the VCSEL device was used. However, when the glass substrate is damaged, a light having a narrow beam angle is released as it is. In order to prevent this, a method of placing a transparent electrode layer on the surface of the glass substrate is used so that an operation of the VCSEL is stopped when the glass substrate is damaged. However, manufacturing costs increase and an operation reliability is not high due to a complicated configuration. In the present embodiment, since a lens array for increasing a beam angle of a light in the light emitting window 141 through which a light emitted from the VCSEL device is transmitted may be formed integrally by molding with a shield can using a silicone resin, the structure is simple, and manufacturing costs may be lowered and the operation reliability can be improved compared to using the glass substrate.

Figure 10:
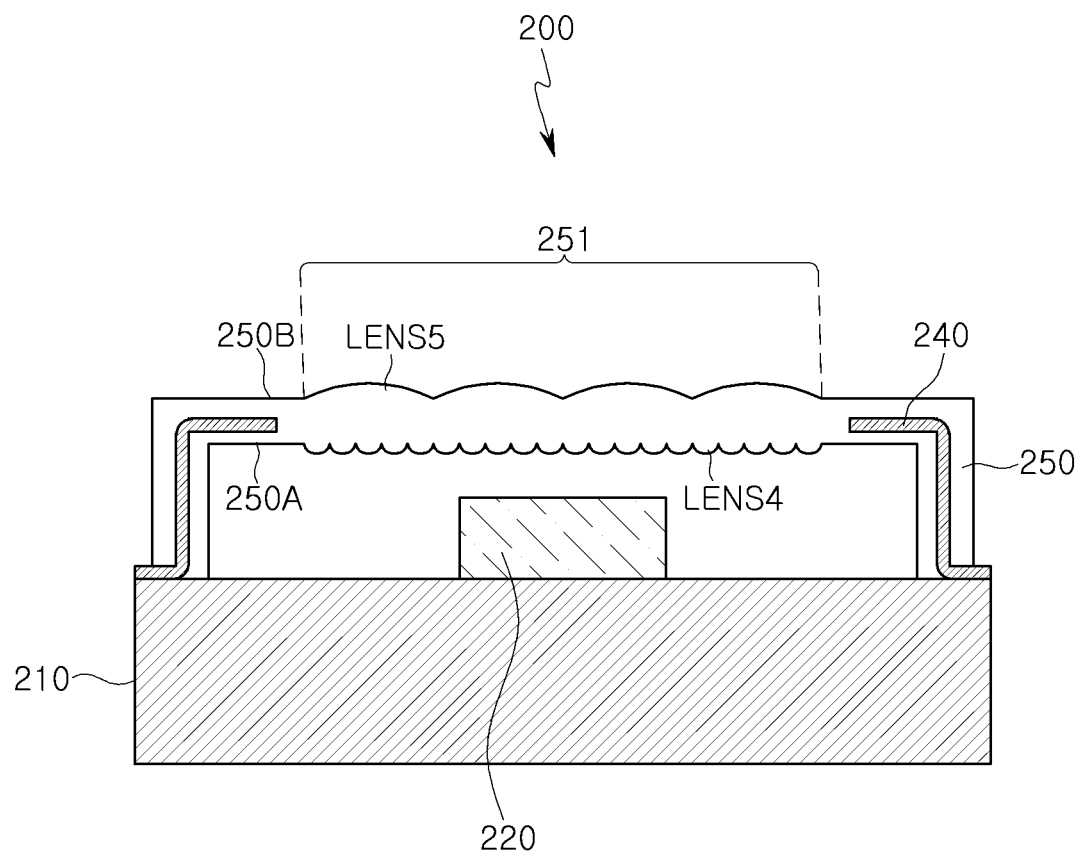
FIG. 10 is a cross-sectional view illustrating a light source package according to an example embodiment.

FIG. 10 is a cross-sectional view illustrating a light source package 200 according to an embodiment. Compared to the previous embodiment of FIGS. 1 to 6, there is a difference in that only a first light source device 220 is disposed without a second light source device. In addition, in the embodiment described above, the first and second lens arrays LA1 and LA2 are disposed on the light transmitting molding, but there is a difference in that a lens unit 251 of the present embodiment includes only first lenses LENS4 on a first surface 250A of a light transmitting molding 250. A configuration in which a plurality of second lenses LENS5 are disposed on a second surface 250B of the light transmitting molding 250 and a configuration of a substrate 210, a first light source device 220, and a shield can 240 are the same as the previous embodiment of FIGS. 1 to 6, and thus, detailed descriptions thereof are omitted to prevent duplicate descriptions.

Figure 11:
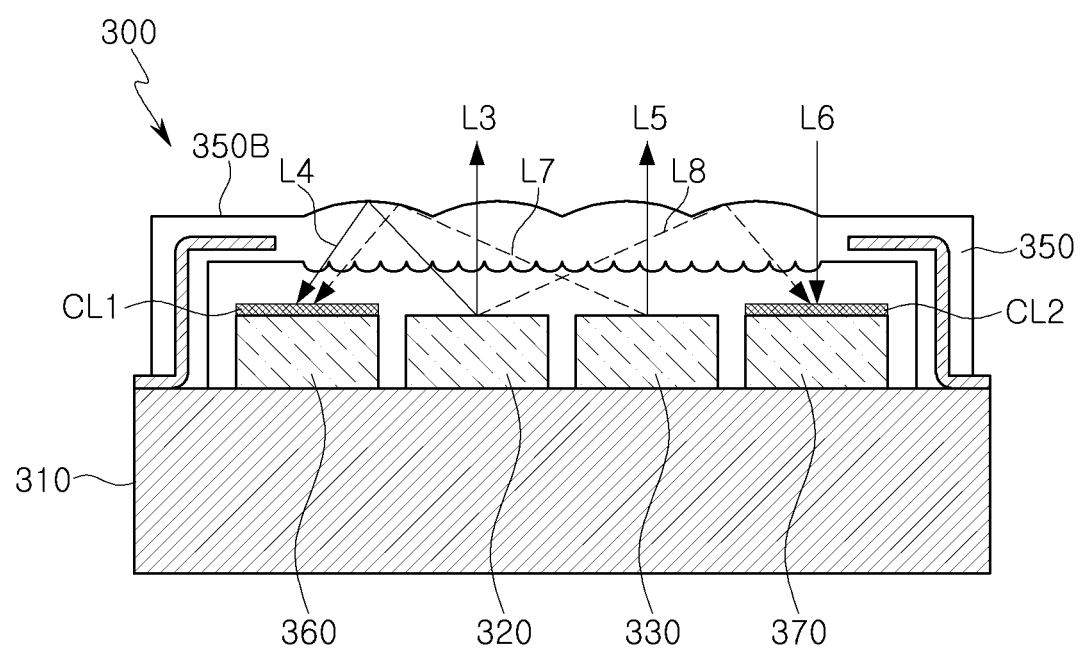
FIG. 11 is a cross-sectional view illustrating a light source package according to an example embodiment.

FIG. 11 is a cross-sectional view illustrating a light source package 300 according to an embodiment. Compared to the previous embodiment of FIGS. 1 to 6, there is a difference in that a photodetector 360, which is a first light sensor adjacent to a first light source device 320, is disposed, and an ambient light sensor ALS 370, which is a second optical sensor adjacent to a second light source device 330, is further disposed. A configuration of a substrate 310, the first and second light source devices 320 and 330, and a shield can 340 are the same as in the above-described embodiment of FIGS. 1 to 6, and thus, detailed descriptions thereof are omitted to prevent duplicate descriptions.

A light L3 constituting most of a light emitted from the first light source device 320 may be emitted out of the light source package 300, but a light L4 emitted from the first light source device 320 and then reflected from a second surface 350B of the light transmitting molding 350 is incident on the photodetector 360 and detected. By this method, an amount of a light of the first light source device 320 may be monitored. In addition, an ambient light sensor 370 may detect a light L6 of a surrounding environment and monitor an amount of a light in the surrounding environment. However, among lights emitted from the first light source device 320, a light L8 incident on the ambient light sensor 370 after being reflected from the second surface 350B of the light transmitting molding 350 may generate an optical crosstalk phenomenon that causes an inaccurate light measurement by the ambient light sensor 370.

In addition, most of a light L5 emitted from the second light source device 330 may be emitted out of the light source package 300, but among lights emitted from the second light source device 330, a light L7 incident on the photodetector 360 after being reflected from the second surface 350B may generate an optical crosstalk phenomenon by which a measurement value of the photodetector 360 can be incorrect.

In the present embodiment, an infrared filter CL1 that passes only a light having a wavelength of about 900 nm or more, or a near-infrared light may be disposed on an upper surface of the photodetector 360, and an infrared cut filter that blocks the light having the wavelength of about 900 nm or more, or the near-infrared light may be disposed on an upper surface of the ambient light sensor 370, such that the reflected light L7 incident on the photodetector 360 may be blocked, and the reflected light L8 incident on the ambient light sensor 370 may be blocked. Therefore, an optical cross talk phenomenon occurring in the photodetector 360 and the ambient light sensor 370 can be reduced.

Figure 12:
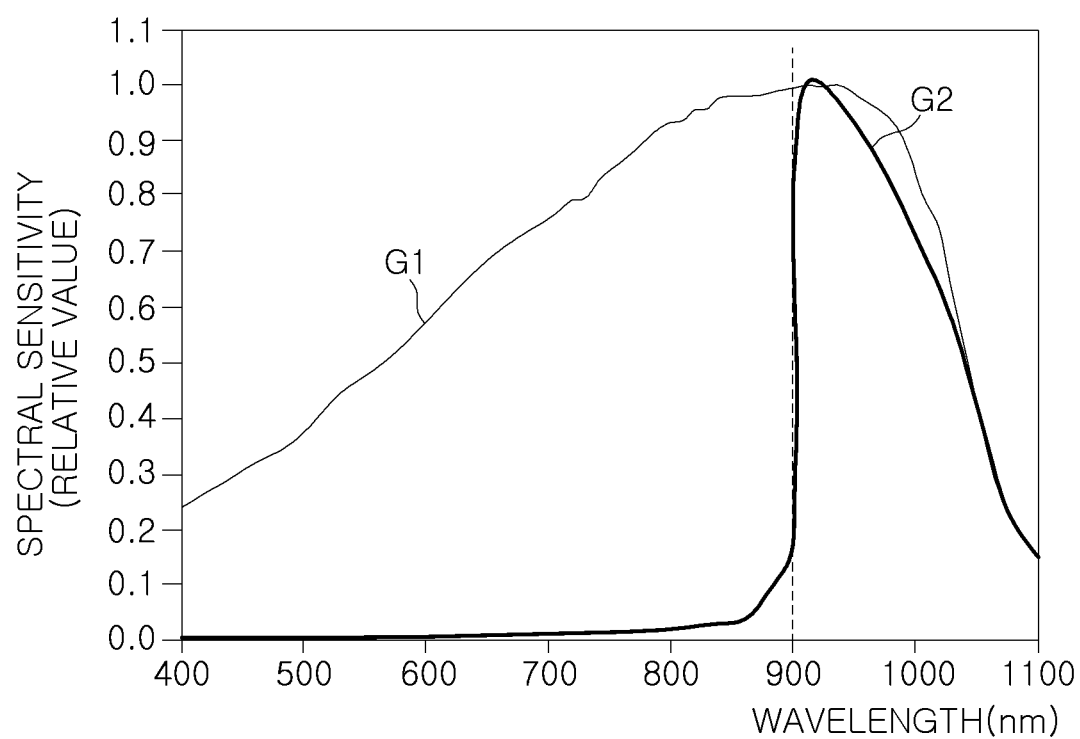
FIG. 12 is a graph illustrating a distribution of a spectral sensitivity when an infrared filter is added to the light source package of FIG. 11, according to an example embodiment.
Figure 13:
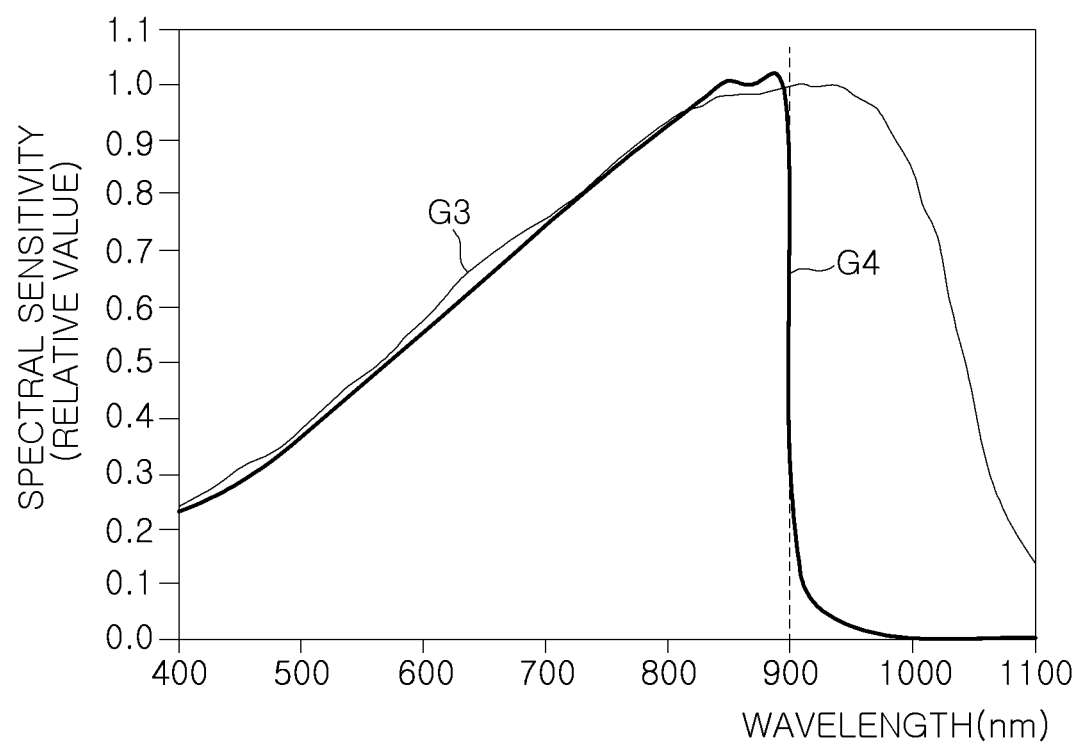
FIG. 13 is a graph illustrating distribution of a spectral sensitivity when an infrared cut filter is added to the light source package of FIG. 11, according to an example embodiment.

FIG. 12 is a graph illustrating a distribution of a spectral sensitivity according to a wavelength when an infrared filter is added to the light source package of FIG. 11, and FIG. 13 is a graph illustrating a distribution of spectral sensitivity according to a wavelength when an infrared cut filter is added to the light source package of FIG. 11.

G1 of FIG. 12 is a graph illustrating a spectral sensitivity of a comparative example in which an infrared filter is not disposed in the photodetector 360 shown in FIG. 11, and G2 is a graph illustrating spectral sensitivity of an embodiment in which the infrared filter is disposed in the photodetector 360. In the case of G2, it can be seen that only an infrared light having a wavelength of 900 nm or more passes.

G3 of FIG. 13 is a graph illustrating a spectral sensitivity of a comparative example in which an infrared cut filter is not disposed in the ambient light sensor 370 shown in FIG. 11, and G4 is a graph illustrating spectral sensitivity of an embodiment in which the infrared cut filter is disposed in the ambient light sensor 370. In the case of G4, it can be seen that infrared light having a wavelength of 900 nm or more is blocked.

Figure 16:
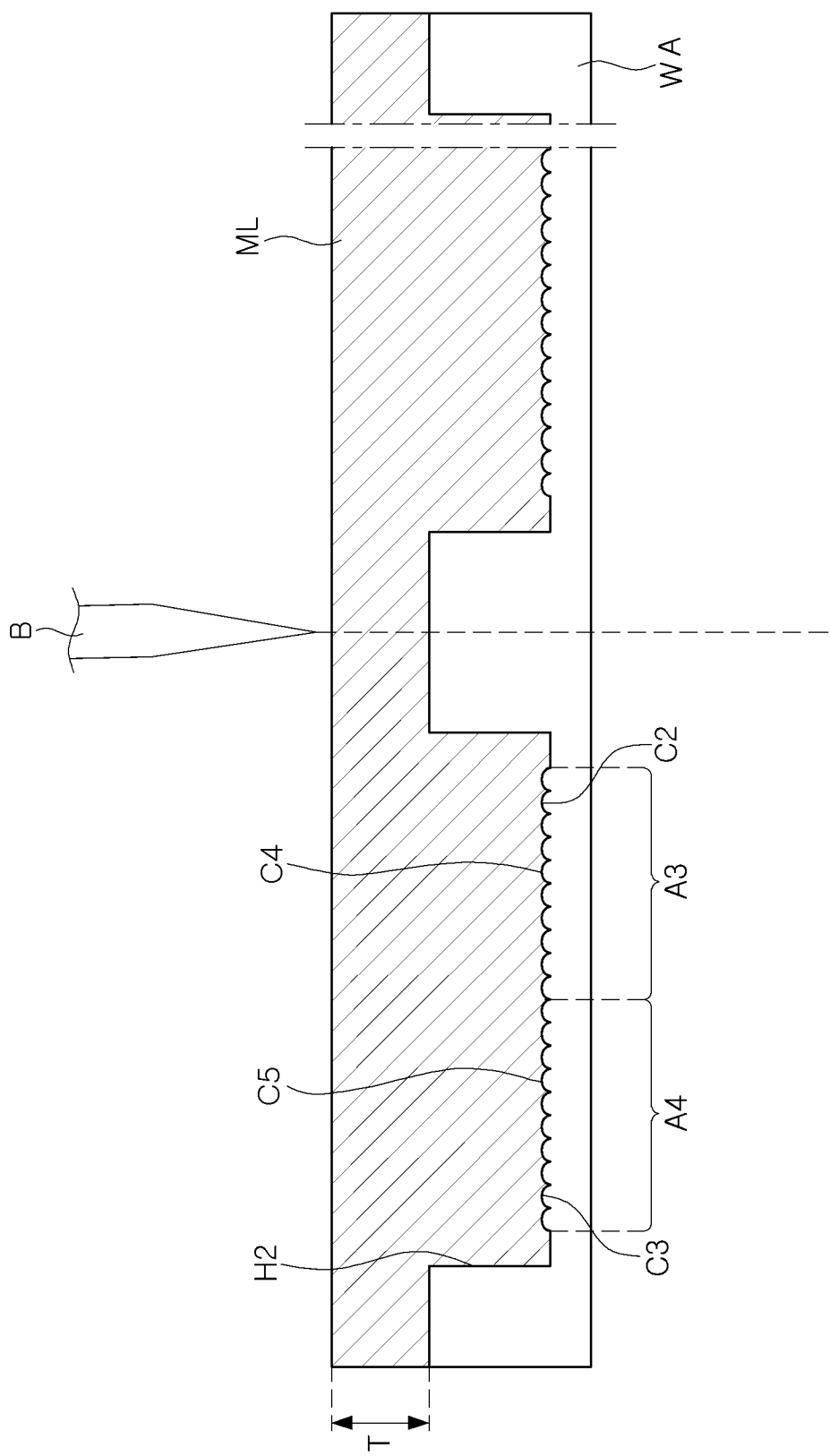
Figure 17:
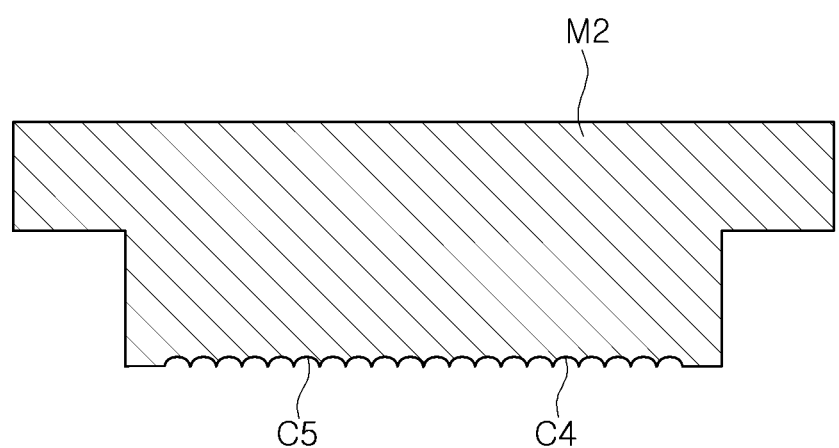
Figure 18:
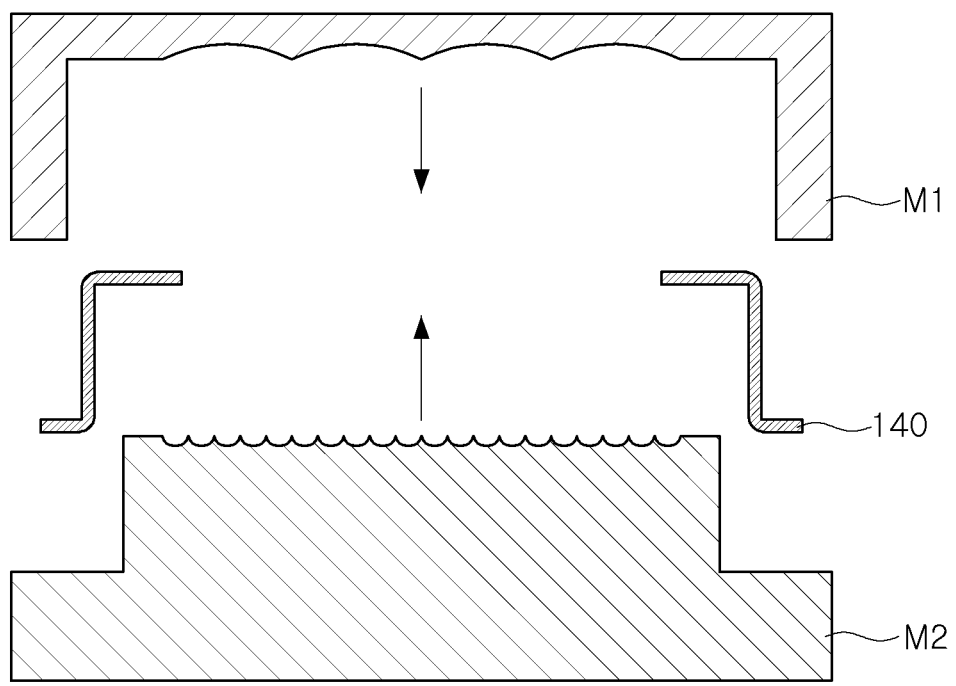

Referring to FIGS. 14 to 18, a manufacturing process of a light source package according to an embodiment will be described. FIGS. 14 to 18 are views schematically illustrating a manufacturing process of the light source package of FIG. 3. Specifically, FIGS. 14 to 17 illustrate a process of manufacturing a mold for manufacturing a light transmissive molding of a light source package, and FIG. 18 illustrates manufacturing a light transmitting molding using the mold.

Figure 14:
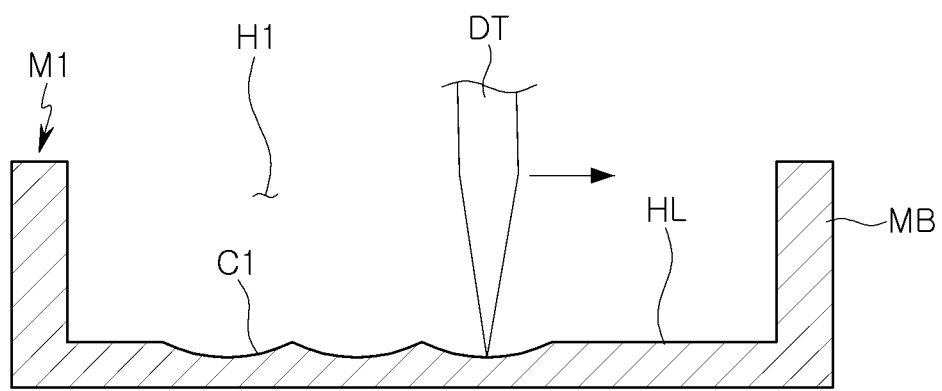
FIGS. 14 to 18 are views schematically illustrating a manufacturing process of the light source package of FIG. 3, according to an example embodiment.

Referring to FIG. 14, an upper mold M1 may be formed by forming a first unevenness portion C1 on a bottom surface HL of a mold body MB in which a groove portion H1 is formed. This process can be done with a diamond turning machine (DTM). A reference numeral DT denotes a cutting tool of the diamond turning machine. The first unevenness C1 may be formed to have a size corresponding to the third lens array LA3 of the embodiment of FIGS. 1 to 6.

Figure 15:
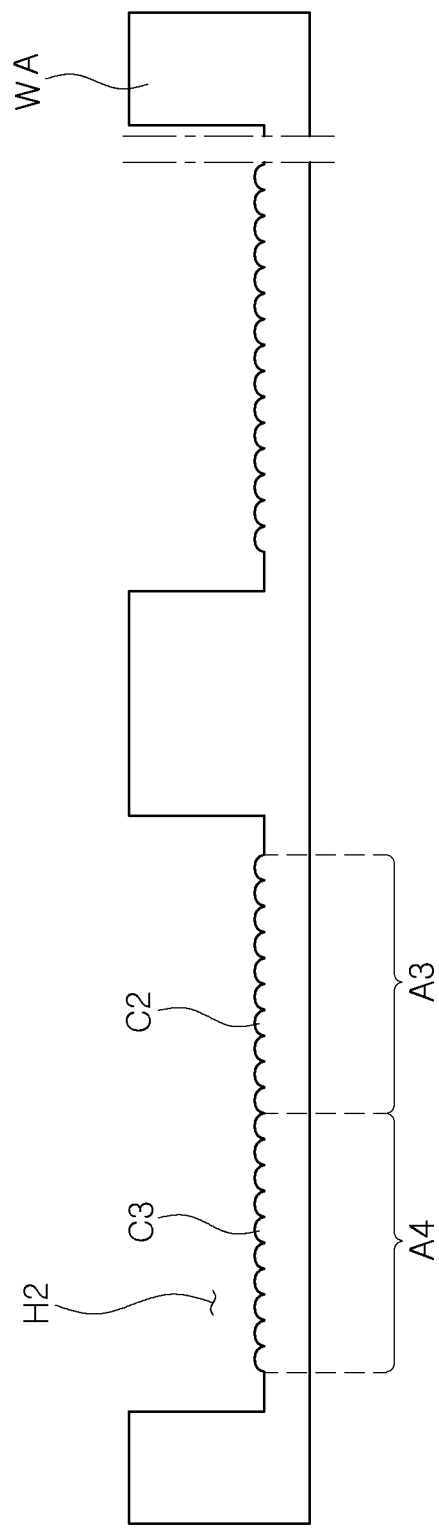

FIGS. 15 to 17 illustrate a process of forming a lower mold.

Referring to FIG. 15, a groove portion H2 may be formed on a wafer WA made of glass, and second and third unevenness portions C2 and C3 may be formed on a bottom surface of the groove portion H2. The groove portion H2 and the second and third unevenness portions C2 and C3 may be formed at once, or may be sequentially formed.

Third and fourth regions A3 and A4 in which the second and third unevenness portions C2 and C3 are disposed, respectively, may be disposed in a region corresponding to the first and second regions A1 and A2 of the embodiment of FIGS. 1 to 6. The second and third unevenness portions C2 and C3 may be formed to have sizes corresponding to the first and second lens arrays LA1 and LA2, respectively, of the embodiment of FIGS. 1 to 6. The second and third unevenness portions C2 and C3 may be formed such that a pitch between two adjacent unevenness portions is any value in a range of 15 μm to 50 μm. Since the unevenness portion of such a fine size cannot be formed through the diamond turning machine described above, it may be formed through a semiconductor manufacturing process. That is, the groove portion H2 and the second and third unevenness portions C2 and C3 may be formed on the wafer WA through a photolithography process through a semiconductor manufacturing process.

Next, as illustrated in FIG. 16, a plating layer ML may be formed to fill the groove portion H2. Since the plating layer ML is separated and used as a mold in a subsequent process, it may be formed to cover the wafer WA with a predetermined thickness T sufficiently to secure mechanical strength. The second and third unevenness portions C2 and C3 of the wafer WA may be transferred to the separated plating layer ML to form fourth and fifth unevenness portions C4 and C5. When the plating layer ML formed by using a blade B is cut into a unit package size, a lower mold M2 of FIG. 17 may be manufactured.

Next, as illustrated in FIG. 18, when the shield can 140 is disposed between the upper mold M1 and the lower mold M2 and a resin is introduced and then molded, the light transmissive molding 150 shown in FIG. 3 may be formed. The light source package 100 may be manufactured by combining the substrate 110 on which the first and second light source devices 120 and 130 are mounted on the light transmissive molding 150 manufactured as described above.

Figure 19:
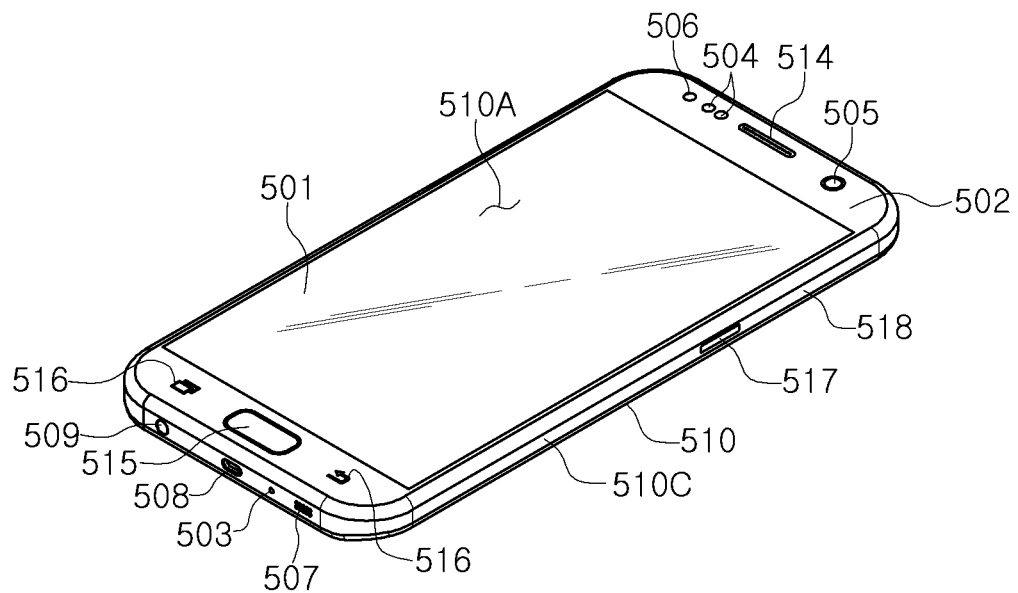
FIGS. 19 and 20 are front and rear perspective views of a mobile device with a camera according to an example embodiment.
Figure 20:
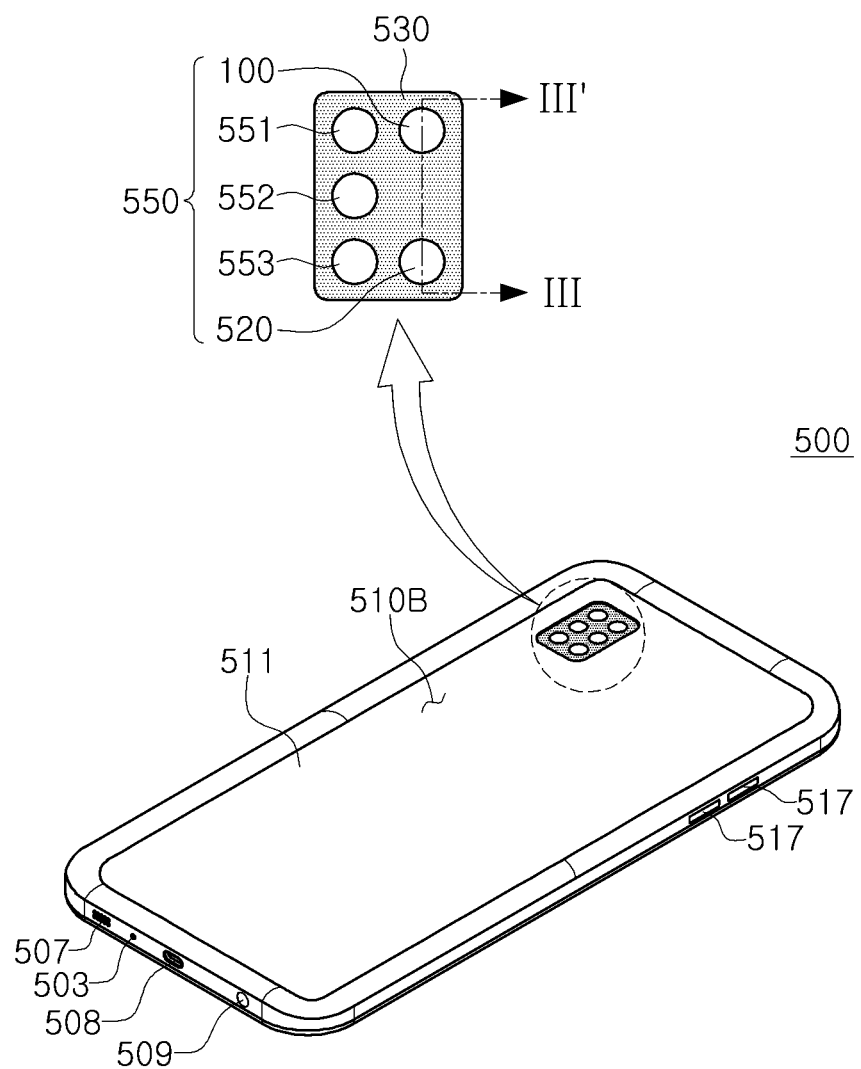
Figure 21:
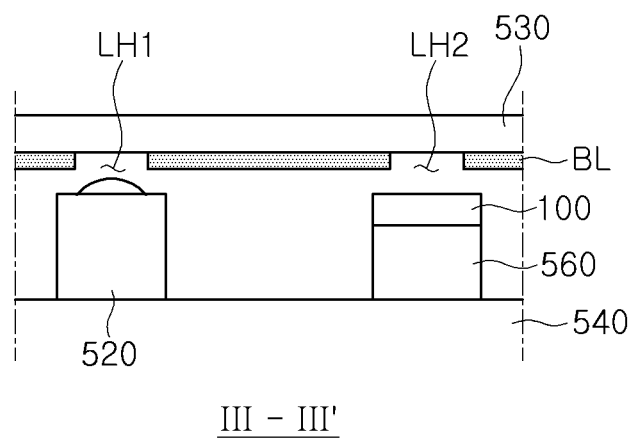
FIG. 21 is a cross-sectional view taken along a line of FIG. 20, according to an example embodiment.

FIGS. 19 and 20 are front and rear perspective views of a camera-embedded mobile device according to an embodiment, respectively, and FIG. 21 is a cross-sectional view of FIG. 20 taken along a line shown therein.

Referring to FIGS. 19 and 20, a mobile device 500 according to the present embodiment may include a housing 510 including a first surface (or a front surface) 510A, a second surface (or a rear surface) 510B, and a side surface 510C surrounding a space between the first surface 510A and the second surface 510B.

In an embodiment, the first surface 510A may be formed by a front plate 502 (e.g., glass or polymer comprising various coating layers), at least partially substantially transparent. The second surface 510B may be formed by a back plate 511, substantially opaque. The back plate 511 may be formed by, for example, a coated or colored glass, a ceramic, a polymer, a metal, or a combination of at least two of the above-described materials. The side surface 510C may be formed by a side bezel structure (or a "side member") 518, which is combined with the front plate 502 and the back plate 511, and includes a metal and/or a polymer.

The mobile device 500 according to the present embodiment may include at least one or more of a display 501, audio modules 503, 507, and 514, a sensor module 504, a plurality of camera modules 505 and 550, key input devices 515, 516, and 517), an indicator 506 and connector holes 508 and 509. In some embodiments, the mobile device 500 may omit at least one of the above-described components or additionally include other components.

The display 501 may be exposed, for example, through a significant portion of the front plate 502. The display 501 may be disposed adjacent to or combined with a touch sensing circuit, a pressure sensor capable of measuring the intensity (pressure) of the touch, and/or a digitizer detecting a magnetic field type stylus pen.

The audio modules 503, 507, 514 may include a microphone hole 503 and speaker holes 507 and 514. In the microphone hole 503, a microphone for acquiring external sounds may be disposed therein, and in some embodiments, a plurality of microphones may be disposed to sense a direction of sounds. The speaker holes 507 and 514 may include an external speaker hole 507 and a call receiver hole 514. In some embodiments, the speaker holes 507 and 514 and the microphone hole 503 may be implemented as one hole, or a speaker may be included without the speaker holes 507 and 514.

The camera modules 505 and 550 may be respectively disposed on the first surface 510A and the second surface 510B of the mobile device 500. The camera modules 505 and 550 may include one or a plurality of lenses, an image sensor, and/or an image signal processor. The camera module 550 disposed on the second surface 510B may include a plurality of red/green/blue (RGB) cameras 551, 552, and 553. The camera module 550 may further include a light source package 100 and a TOF camera 520. The plurality of RGB cameras 551, 552, and 553 may include an ultra wide-angle lens camera 551, a wide-angle lens camera 552, and a narrow-angle lens camera 553. The light source package 100 may provide a white light for a plurality of RGB cameras 551, 552, and 553 and a near-infrared light for the TOF camera 520 in one package. Referring to FIG. 21, the light source package 100 may be mounted on a substrate 540 in the form of a package on package (POP) module combined with an interposer 560, and the interposer 560 may be a wiring substrate made of a material such as FR4. In addition, a driver integrated circuit (IC) for controlling the light source package 100 may be disposed inside the interposer 560. The camera module 550 and the light source package 100 may be provided in a single module form, and a transparent substrate 530 such as a glass for protecting the camera module 550 and the light source package 100 may be disposed on the front surface. A light blocking layer BL may be disposed on one surface of the transparent substrate 530, and holes LH1 and LH2 for light transmission may be disposed in a region corresponding to the camera module 550 and the light source package 100.

The sensor module 504 may generate an electrical signal or a data value corresponding to an internal operating state of the mobile device 500 or an external environmental state. The sensor module 504 may be, for example, a proximity sensor.

The key input devices 515, 516, 517 may include a home key button 515 disposed on the first surface 510A of the housing 510, a touch pad 516 disposed at a periphery of the home key button 515, and/or a side key button 517 disposed on the side surface 510C of the housing 510. In some embodiments, the mobile device 500 may not include some or all of the components described above, and instead of this, the mobile device 500 may be implemented with other input means, such as soft keys, on the display 501.

The indicator 506 may be disposed on, for example, the first surface 510A of the housing 510. The indicator 506 may provide, for example, status information of the mobile device 500 in a light form, and may include an LED. The connector holes 508 and 509 may include a first connector hole 508 for receiving a connector (e.g., a USB connector) for transmitting and receiving power and/or data with an external electronic device, and a second connector hole 509 for receiving a connector (e.g., an earphone jack) for transmitting and receiving audio signals with an external electronic device.

The sensor-integrated flash LED package according to the present embodiment can be advantageously applied to various electronic devices having a camera or an image sensor, in addition to the mobile communication terminal as in the previous example embodiment.

As set forth above, according to an embodiment, a light source package in which light sources having different functions are integrated in one package, and improved robustness and reliability can be provided.

Various and beneficial advantages and effects of the inventive concept are not limited to the above, and will be more readily understood in the course of describing specific embodiments of the inventive concept.

While various example embodiments have been shown and described above, it will be apparent to those skilled in the art that modifications and variations could be made without departing from the scope of the inventive concept as defined by the appended claims.

What is claimed is:

1. A light source package comprising:
    a substrate having first and second surfaces opposite to each other, and having a device mounting region;
    a first light source device disposed in the device mounting region, and configured to emit a light of a first wavelength;
    a second light source device disposed to be spaced apart from the first light source in the device mounting region, and configured to emit a light of a second wavelength, different from the first wavelength;
    a shield can disposed to enclose the first and second light source devices, and providing a light emitting window through which the lights of the first and second wavelengths are emitted out; and
    a light transmissive molding disposed on the light emitting window and comprising a first lens array of a plurality of first lenses each of which vertically overlaps the first light source device, and a second lens array of a plurality of second lenses each of which vertically overlaps the second light source device, in a plan view of the light source package.

2. The light source package of claim 1, wherein the first light source device comprises a vertical cavity surface emitting laser (VCSEL) device, and the second light source device comprises a light emitting diode device.

3. The light source package of claim 2, wherein the first lens array comprises a plurality of first lenses arranged at a predetermined pitch and having the same area,
 wherein the second lens array comprises a plurality of second lenses arranged at the predetermined pitch and having the same area,
 wherein a surface shape of each of the plurality of first lenses is different from a surface shape of each of the plurality of second lenses.

4. The light source package of claim 3, wherein the predetermined pitch has a value in a range of 15 µm to 50 µm.

5. The light source package of claim 4, wherein the first light source device is disposed toward the light emitting window, and has a plurality of emitters spaced apart at the predetermined pitch.

6. The light source package of claim 2, wherein the first lens array is configured to increase a beam angle of the light of the first wavelength, and
 wherein the second lens array is configured to reduce a beam angle of the light of the second wavelength.

7. The light source package of claim 6, wherein the first lens array comprises a plurality of first lenses in which a height and a length has a ratio of height/length <1, and
 wherein the second lens array comprises a plurality of second lenses in which a height and a length has a ratio of height/length ≥1.

8. The light source package of claim 2, further comprising:
 a first optical sensor disposed to be adjacent to the first light source device, and having a first light receiving region; and
 a second optical sensor disposed to be adjacent to the second light source device, and having a second light receiving region.

9. The light source package of claim 8, wherein an infrared filter is further disposed in the first light receiving region of the first optical sensor, and
 wherein an infrared cut filter is further disposed in the second light receiving region of the second optical sensor.

10. The light source package of claim 9, wherein the infrared filter is configured to pass a light of a wavelength of 900 nm or more, and
 wherein the infrared cut filter is configured to block the light of the wavelength of 900 nm or more.

11. The light source package of claim 8, wherein the first optical sensor comprises a photodetector configured to detect the light of the first wavelength, and
 wherein the second optical sensor comprises an ambient light sensor.

12. The light source package of claim 1, wherein the light transmissive molding is formed of at least one of a silicone resin, an epoxy resin, and an acrylic resin.

13. The light source package of claim 1, wherein the light transmissive molding has a first surface facing the device mounting region and a second surface opposite to the first surface,
 wherein the first and second lens arrays are disposed on the first surface.

14. The light source package of claim 13, further comprising a third lens array disposed on the first surface of the light transmissive molding to overlap the light emitting window.

15. The light source package of claim 1, further comprising a ground electrode disposed at an edge of the substrate and connected to the shield can.

16. The light source package of claim 1, wherein the light transmissive molding encompasses the light emitting window.

17. A light source package comprising:
 a substrate having a device mounting region;
 a vertical cavity surface emitting laser (VCSEL) device disposed in the device mounting region;
 a shield can disposed to enclose the VCSEL device, grounded to a ground electrode of the substrate, and providing a light emitting window, through which a light emitted from the VCSEL device is output; and
 a light transmissive molding disposed on the light emitting window and supporting the shield can, the light transmissive molding comprising a lens array formed of a plurality of lenses having a predetermined pitch and disposed to vertically overlap the light emitting window in a plan view,
 wherein the lens array comprises at least one of a silicone resin, an epoxy resin, and an acrylic resin forming the light transmissive molding.

18. The light source package of claim 17, wherein the VCSEL device is disposed toward the light emitting window, and having a plurality of emitters spaced apart from one another at a preset pitch.

19. The light source package of claim 17, wherein the predetermined pitch has a value in a range of 15 µm to 50 µm.

20. A light source package comprising:
 a substrate;
 a first light source device disposed on the substrate, and configured to emit a light of a first wavelength;
 a second light source device disposed to be spaced apart from the first light source on the substrate, and configured to emit a light of a second wavelength, different from the first wavelength; and
 a light transmissive structure disposed above first and second light source devices, and comprising at least one first lens configured to increase a beam angle of the light of the first wavelength and at least one second lens configured to reduce a beam angle of the light of the second wavelength.

21. A mobile device comprising:
 a housing having a first surface and a second surface opposite to each other;
 a camera module mounted on at least one of the first and second surfaces of the housing; and
 the light source package of claim 20 mounted adjacent to the camera module on at least one of the first and second surfaces of the housing.

\* \* \* \* \*